US010714407B2

(12) United States Patent
Ushikubo et al.

(10) Patent No.: US 10,714,407 B2
(45) Date of Patent: Jul. 14, 2020

(54) AMPLIFICATION APPARATUS

(71) Applicant: TOKYO KEIKI INC., Tokyo (JP)

(72) Inventors: Takayuki Ushikubo, Tokyo (JP);
Hajime Tamura, Tokyo (JP); Hiroaki Saito, Tokyo (JP); Shunichi Hirano, Tokyo (JP)

(73) Assignee: TOKYO KEIKI INC., Tokyo (JP)

( * ) Notice: Subject to any disclaimer, the term of this patent is extended or adjusted under 35 U.S.C. 154(b) by 23 days.

(21) Appl. No.: 16/098,760

(22) PCT Filed: Jun. 13, 2017

(86) PCT No.: PCT/JP2017/021823
§ 371 (c)(1),
(2) Date: Nov. 2, 2018

(87) PCT Pub. No.: WO2017/221769
PCT Pub. Date: Dec. 28, 2017

(65) Prior Publication Data
US 2019/0122957 A1    Apr. 25, 2019

(30) Foreign Application Priority Data

Jun. 24, 2016   (JP) .................................. 2016-125239

(51) Int. Cl.
*H03F 1/07*      (2006.01)
*H01L 23/473*    (2006.01)
(Continued)

(52) U.S. Cl.
CPC ............. *H01L 23/473* (2013.01); *H03F 1/30* (2013.01); *H03F 3/19* (2013.01); *H03F 3/195* (2013.01);
(Continued)

(58) Field of Classification Search
CPC ................................ H03F 1/07; H03F 1/0288
(Continued)

(56) References Cited

U.S. PATENT DOCUMENTS 5,128,628 A     7/1992  Marks et al.
5,208,554 A *   5/1993  Endler .................... H03F 3/604
                                                            330/124 R
(Continued)

FOREIGN PATENT DOCUMENTS

JP    H 06-021735 A    1/1994
JP    H 06-045850 A    2/1994
(Continued)

OTHER PUBLICATIONS

International Search Report (ISR) (PCT Form PCT/ISA/210), in PCT/JP2017/021823, dated Sep. 5, 2017.

*Primary Examiner* — Henry Choe
(74) *Attorney, Agent, or Firm* — McGinn IP Law Group, PLLC (57) ABSTRACT

An amplification apparatus includes: a signal splitter for splitting an input radio frequency signal and outputting the resulting split radio frequency signals; a plurality of amplifier units for amplifying the radio frequency signals outputted from the signal splitter, the amplifier units being disposed circularly to form a generally cylindrical shape; a plurality of water cooling heat sinks disposed circularly at positions corresponding to the positions of the plurality of amplifier units so as to cool the plurality of amplifier units by cooling water; and a signal combiner for combining the radio frequency signals outputted from the plurality of amplifier units, respectively, and outputting the resulting combined radio frequency signal.

5 Claims, 5 Drawing Sheets

(51) Int. Cl.
*H03F 3/68* (2006.01)
*H03F 3/60* (2006.01)
*H03F 3/21* (2006.01)
*H03F 3/195* (2006.01)
*H03F 1/30* (2006.01)
*H03F 3/19* (2006.01)

(52) U.S. Cl.
CPC ............... *H03F 3/21* (2013.01); *H03F 3/211* (2013.01); *H03F 3/60* (2013.01); *H03F 3/68* (2013.01); *H03F 2200/231* (2013.01); *H03F 2200/451* (2013.01); *H03F 2200/465* (2013.01); *H03F 2203/21106* (2013.01); *H03F 2203/21118* (2013.01); *H03F 2203/21136* (2013.01); *H03F 2203/21142* (2013.01)

(58) Field of Classification Search
USPC .............................................. 330/124 R, 295
See application file for complete search history.

(56) References Cited

U.S. PATENT DOCUMENTS

| | | | |
|---|---|---|---|
| 5,218,322 A * | 6/1993 | Allison | H01P 5/12 330/286 |
| 6,078,222 A | 6/2000 | Harris et al. | |
| 6,359,504 B1 * | 3/2002 | Cozzarelli | H03F 1/0277 330/124 R |
| 6,639,463 B1 * | 10/2003 | Ghanadan | H03F 3/602 330/124 R |
| 9,595,930 B2 * | 3/2017 | Garuti | H01P 1/36 |

FOREIGN PATENT DOCUMENTS

| | | |
|---|---|---|
| JP | H 06-152278 A | 5/1994 |
| JP | H 06-237089 A | 8/1994 |
| JP | H 06-302982 A | 10/1994 |
| JP | 2013-236310 A | 11/2013 |

* cited by examiner

AMPLIFICATION APPARATUS

TECHNICAL FIELD

The present invention relates to a signal amplification technique for amplifying radio frequency (RF) signals.

BACKGROUND OF THE INVENTION

There is a known amplification apparatus having a solid state power amplifier (SSPA) for providing amplification capability of RF signals, which may be used in place of magnetron oscillators having a magnetron as an oscillator/amplifier element. A typical such SSPA based amplification apparatus has: a signal splitter for splitting an RF signal into a plurality of split RF signals; a plurality of amplifier units for amplifying the split RF signals, respectively; and a signal combiner for combining the amplified RF signals together into a combined output RF signal. This structure is desirable because so high an output power level is required while a sole amplifier unit has only a limited capacity. Advantages of SSPA based amplification apparatuses in comparison to magnetron oscillators are a longer operational life and a higher easiness in maintenance.

As a related technique, a power amplification apparatus is known from Patent Document No. 1 listed below (Japanese Unexamined Patent Application Publication No. Hei-6-152278 (1994-152278)), which has: a power splitter and a power combiner disposed facing to each other; and a plurality of amplifier units disposed between the power splitter and the power combiner.

PRIOR ART DOCUMENT(S)

Patent Document(s)

Patent Document No. 1: Japanese Unexamined Patent Application Publication No. Hei-6-152278 (1994-152278))

SUMMARY OF THE INVENTION

Problems to be Solved by the Invention

With the above type of an amplification apparatus having a plurality of amplifier units, the amplifier units have to be cooled equally with one another, in order to ensure that the split RF signals may be amplified by the amplifier units uniformly with one another before inputted into the signal combiner. Unfortunately, with a prior art amplification apparatus of this type, a cooling system, in particular a water cooling system, tends to occupy so large a portion of the internal volume of the amplification apparatus, which leads to a problem of difficulty in making more compact the amplification apparatus of this type.

The present invention is achieved in order to solve the above mentioned problem. Accordingly, it is an object of the present invention to provide an amplification apparatus having a plurality of amplifier units, in which the plurality of amplification units may be cooled by means of a more compact cooling system.
Resolution In order to achieve the above object, an amplification apparatus according to the present invention comprises: a signal splitter for splitting an input radio frequency signal and outputting the resulting split radio frequency signals; a plurality of amplifier units for amplifying the radio frequency signals outputted from the signal splitter, the amplifier units being disposed circularly to form a generally cylindrical shape; a plurality of water cooling heat sinks disposed circularly at positions corresponding to the positions of the plurality of amplifier units so as to cool the plurality of amplifier units by means of cooling water; and a signal combiner for combining the radio frequency signals outputted from the plurality of amplifier units, respectively, and outputting the resulting combined radio frequency signal.

Advantages Provided by the Invention

According to the present invention, there is advantageously provided an amplification apparatus having a plurality of amplifier units, in which the plurality of amplification units may be cooled by means of a more compact cooling system.

EXEMPLARY MODE FOR CARRYING OUT THE INVENTION

Hereinafter, an embodiment of the present invention will be described with reference to the accompanying drawings.

Figure 1:
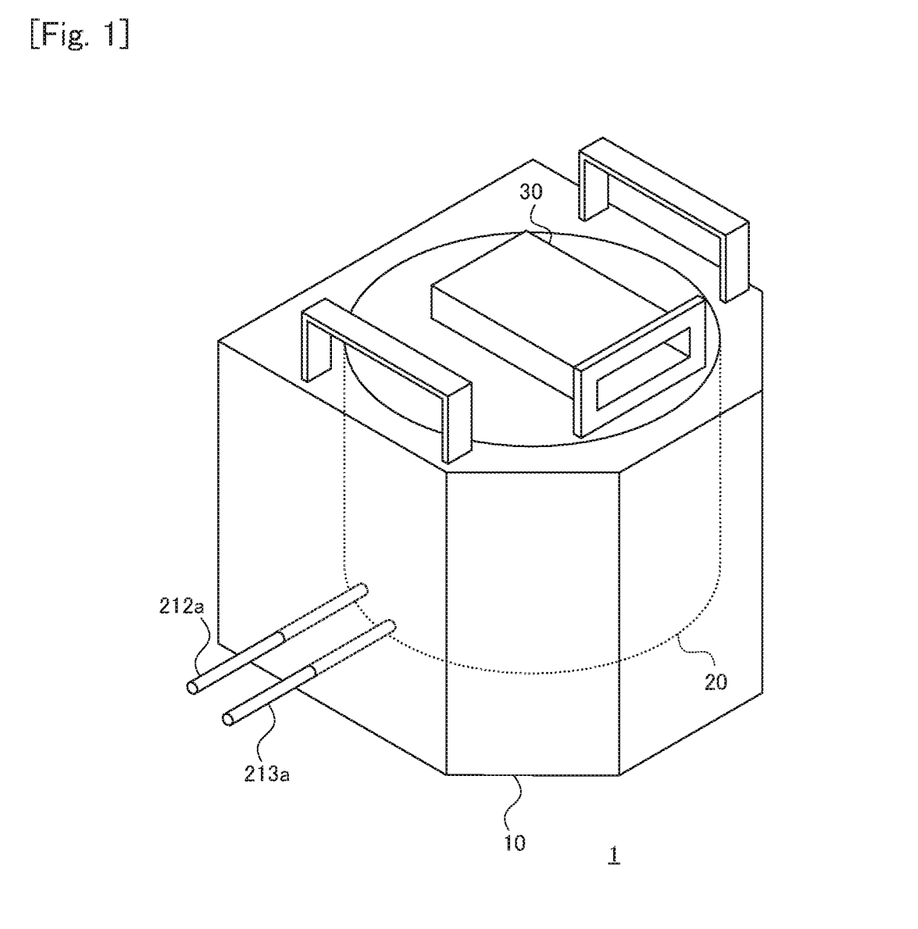
FIG. 1 is a schematic perspective view of an amplification apparatus according to an embodiment of the present invention for illustrating the structure thereof.
Figure 2:
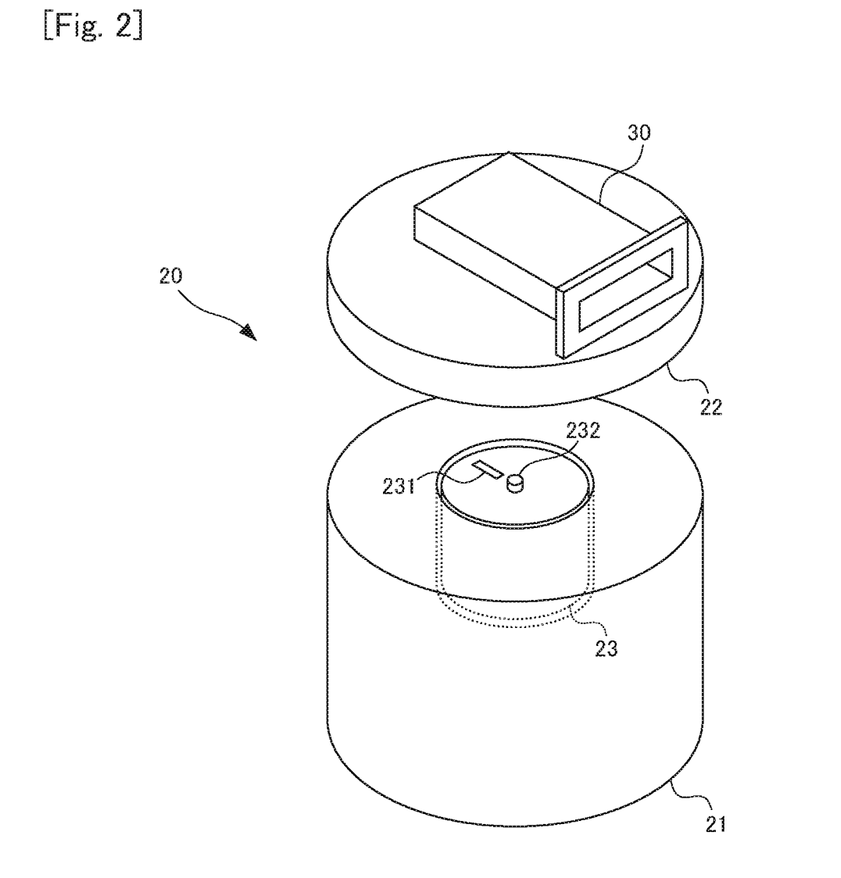
FIG. 2 is a schematic perspective view of an internal unit for illustrating the structure thereof.
Figure 3:
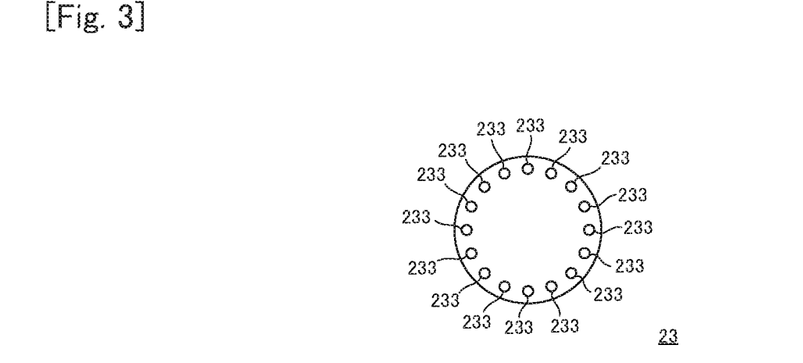
FIG. 3 is a schematic bottom view of a central module.
Figure 4:
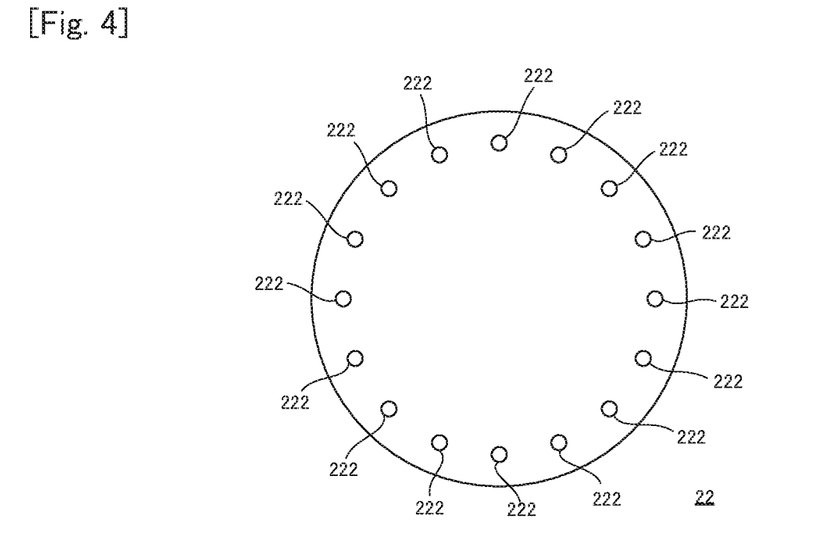
FIG. 4 is a schematic bottom view of a signal combiner.

First, an amplification apparatus according to an embodiment of the present invention and an internal unit of the amplification apparatus will be described in general. FIG. 1 is a schematic perspective view of an amplification apparatus according to an embodiment of the present invention for illustrating the structure thereof. FIG. 2 is a schematic perspective view of an internal unit for illustrating the structure thereof. FIG. 3 is a schematic bottom view of a central module. FIG. 4 is a schematic bottom view of a signal combiner.

As shown in FIG. 1, the amplification apparatus 1 includes a housing 10, an internal unit 20, and a hollow waveguide 30. The housing 10 has an internal space, which is in connection with an external cooling water supply source through a water supply tube 212*a* for supplying cooling water, as well as in connection with an external water drainage system through a water drainage tube 213*a* for draining cooling water. By means of these tubes 212*a* and 213*a*, the supply/drainage of cooling water to/from the internal unit 20 is provided. The supply and drainage of cooling water will be described later in more detail.

As shown in FIG. 2, the internal unit 20 includes: i) a cylindrical module 21 having a generally cylindrical shape defining a hollow space; ii) a signal combiner 22 having a circular disk shape, which corresponds to the shape of the top of the cylindrical module 21, and disposed on the top of the cylindrical module 21; and iii) a central module 23 having a generally cylindrical shape and disposed within the hollow space of the cylindrical module 21. The hollow waveguide 30 is attached on the top of the signal combiner 22, with its waveguide opening facing sideward.

The central module 23 has a control signal input terminal 231 and an RF signal input terminal 232 both provided on the top surface of the central module 23. As shown FIG. 3, the central module 23 has sixteen RF signal output terminals 233, which are disposed circumferentially equidistant on the bottom surface of the central module 23. With this structure, the central module 23 serves to split an input RF signal received at the RF signal input terminal 232, and to output the resulting split RF signals from the respective RF output terminals 233 to the cylindrical module 21.

The cylindrical module 21 serves to amplify the RF signals outputted from the respective RF output terminals 233 and to output the resulting amplified RF signals to the signal combiner 22. Components of the cylindrical module 21 will be described later in detail.

As shown in FIG. 4, the signal combiner 22 has sixteen RF input terminals 222, which are disposed circumferentially equidistant on the bottom of the signal combiner 22. The signal combiner 22 serves to combine the received RF signals, which are outputted from the cylindrical module 21 and received at the respective RF input terminals 222 of the signal combiner 22, and to output the resulting combined RF signal to the hollow waveguide 30.

Figure 5:
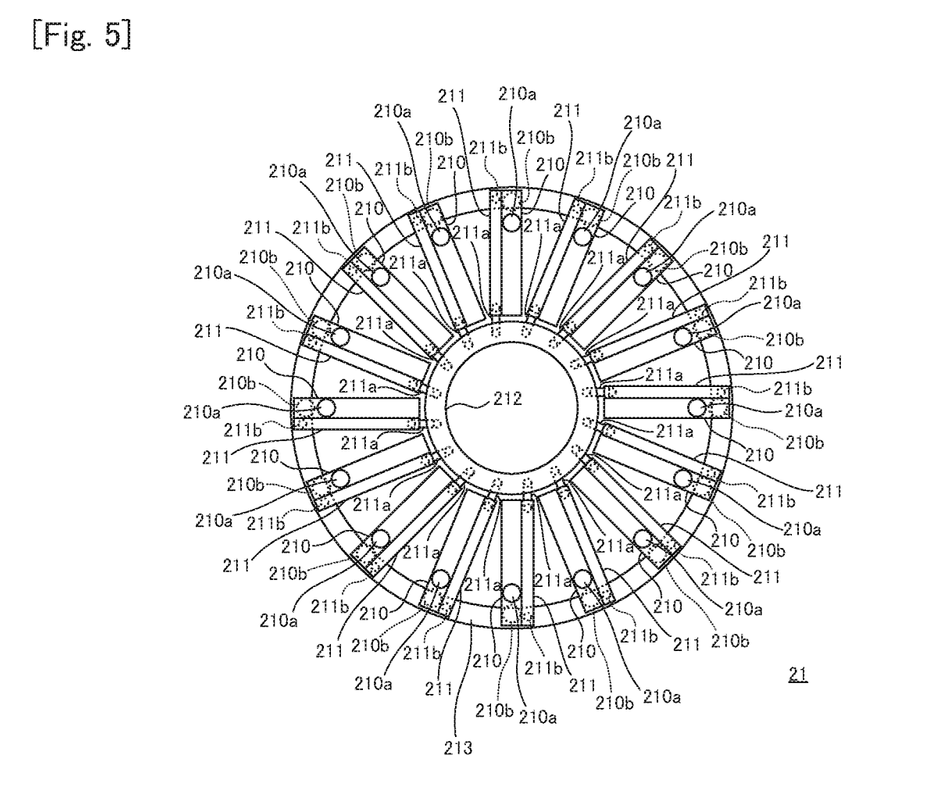
FIG. 5 is a schematic plan view of a cylindrical module for illustrating the structure thereof.
Figure 6:
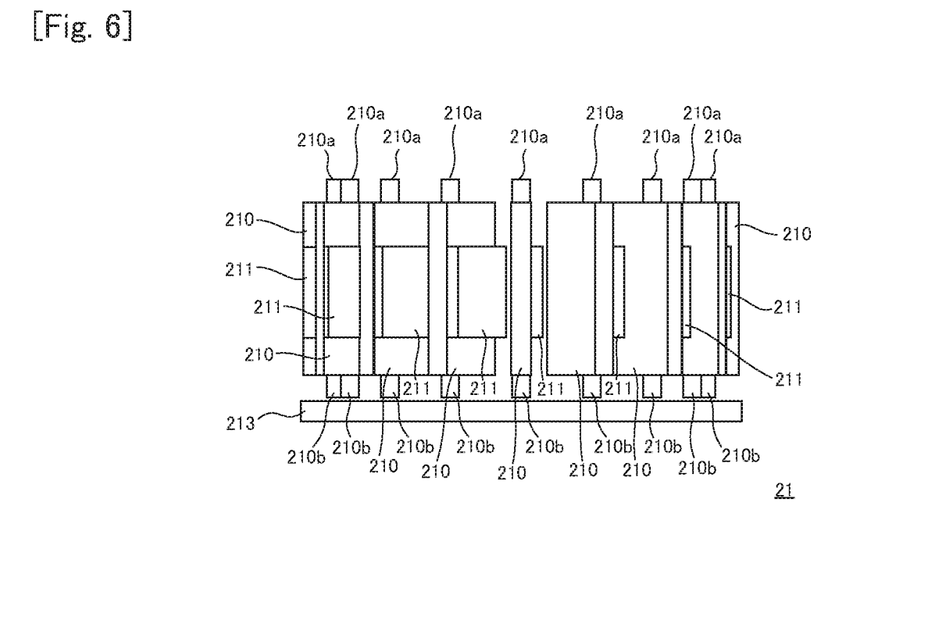
FIG. 6 is a schematic side view of the cylindrical module for illustrating the structure thereof.
Figure 7:
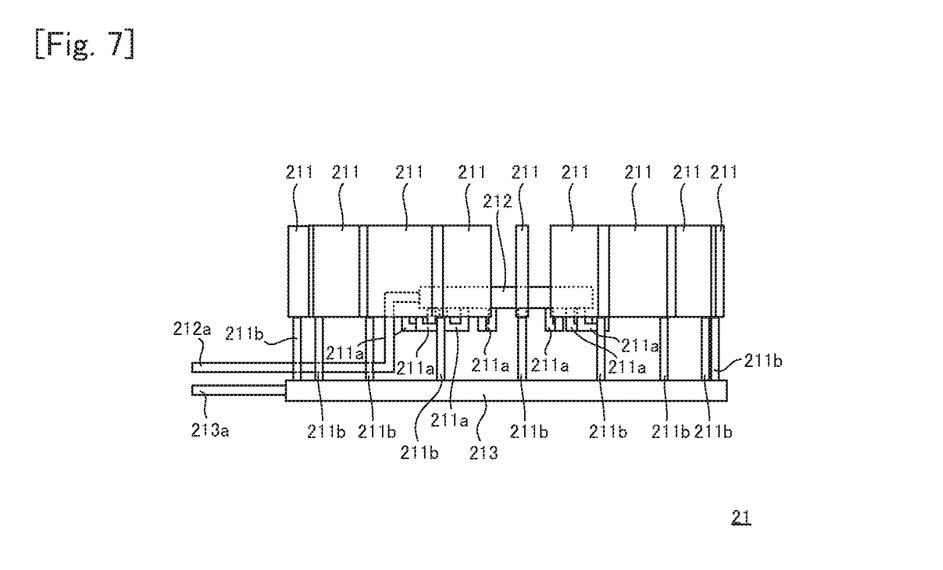
FIG. 7 is a schematic side view of a cooling system equipped in the cylindrical module.

Next, will be described the structure of the cylindrical module. FIG. 5 is a schematic plan view of the cylindrical module for illustrating the structure thereof. FIG. 6 is a schematic side view of the cylindrical module for illustrating the structure thereof. FIG. 7 is a schematic side view of a cooling system equipped in the cylindrical module. For clarity, in FIG. 5, the water supply tube and the water drainage tube are omitted from illustration, and in FIG. 6, a part of the path of the cooling water is omitted from illustration.

As shown in FIGS. 5 and 6, the cylindrical module 21 has sixteen amplifier units 210 having the same structure and disposed circularly along the circumference of the cylindrical module 21, and sixteen water cooling heat sinks 211 having the same structure and each associated with one of the amplifier units 210. The cylindrical module 21 further includes a water supply rim pipe 212 having a circular ring shape and a water drainage rim pipe 213 also having a circular ring shape.

Each amplifier unit 210 is formed in an elongate, flat, rectangular box shape having a length and a width, and is disposed such that the length direction is in alignment with the height direction of the cylindrical module 21 and the width direction with the radial direction of the cylindrical module 21. The width of the amplifier unit 210, which extends in the radial direction of the cylindrical module 21, is smaller than the radius of the latter, so that the cluster of the sixteen amplifier units 210 has a ring shape defining a central, cylindrical, hollow space, the cylindrical shape of which has an axis in alignment with the axis of the cylindrical module 21 and has a predetermined radius. Each amplifier unit 210 has an RF signal output terminal 210a on the top surface thereof for outputting an RF signal to the signal combiner 22, and an RF signal input terminal 210b on the bottom surface thereof for receiving an RF signal from the central module 23. Each output terminal 210a is in direct connection with associated one of the RF signal input terminals 222 of the signal combiner 22, while each input terminal 210b is in connection with associated one of the RF output terminals 233 of the central module 23 through an associated signal cable.

Each water cooling heat sink 211 is formed in a rectangular box shape and has a water tank in which an amount of water may be contained. Each water cooling heat sink 211 is disposed such that it is in contact with one of the pair of side surfaces of the associated one of amplifier units 210, in which the pair of side surfaces of each amplifier unit 210 extend perpendicular to the circumferential direction of the cylindrical module 21. Further, each water cooling heat sink 211 has an inlet tube 211a through which cooling water flows into the water cooling heat sink 211 and an outlet tube 211b through which cooling water flows out of the water cooling heat sink 211. As shown in FIGS. 5 and 7, the inlet tube 211a has one end connected with a first opening formed in the bottom wall of the water cooling heat sink 211, and the outlet tube 211b has one end in connection with a second opening formed in the bottom wall of the water cooling heat sink 211.

The water supply rim pipe 212 is a circular ring shaped pipe, and the radius of the ring is smaller than that of the cylindrical hollow space defined by the circularly disposed sixteen amplifier units 210. As shown in FIG. 7, the water supply tube 212a has one end in connection with the water supply rim pipe 212, and the inlet tubes 211a of the heat sinks 211 each has the other end in connection with the water supply rim pipe 212. The water supply rim pipe 212 has openings which are in connection with the inlet tubes 211a of the heat sinks 211, respectively, and which are disposed circumferentially equidistant, like the amplifier units 210 which are disposed equidistant along the circumference of the cylindrical module 21. By virtue of this structure, the water supply rim pipe 212 is capable of letting the cooling water, which is supplied from the water supply tube 212a, flow into the sixteen water cooling heat sinks 211 under the same flowing conditions. When the central module 23 is inserted and set in place within the cylindrical module 21, the water supply rim pipe 212 is disposed within the hollow space and below the central module 23.

The water drainage rim pipe 213 is a circular ring shaped pipe, and the radius of the ring is greater than that of the water supply rim pipe 212. As shown in FIG. 7, the water drainage tube 213a has one end in connection with the water drainage rim pipe 213, and the outlet tubes 211b of the heat sinks 211 each has the other end in connection with the water drainage rim pipe 213. The water drainage rim pipe 213 has openings which are in connection with the outlet tubes 211a, respectively, and which are disposed circumferentially equidistant, like the amplifier units 210 as described, as well as like the openings of the water supply rim pipe 212. By virtue of this structure, the water drainage rim pipe 213 is capable of letting the cooling water, which flows through the sixteen water cooling heat sinks 213, flow out of the heat sinks 211 under the same flowing conditions, and the cooling water thus flown out is discharged out of the amplification apparatus 1 through the water drainage tube 213a. The water drainage rim pipe 213 is disposed below the amplification units 210.

As described above, the cooling system includes, in particular, the plurality of water cooling heat sinks, the water supply rim pipe and the water drainage rim pipe. By virtue of this structure, the portion of the central space that is occupied by the cooling system may be minimized, while it is ensured that the plurality of amplifier units may be cooled equally with one another. Further, the central module may be disposed within the central space, which facilitates making more compact the amplification apparatus.

Figure 8:
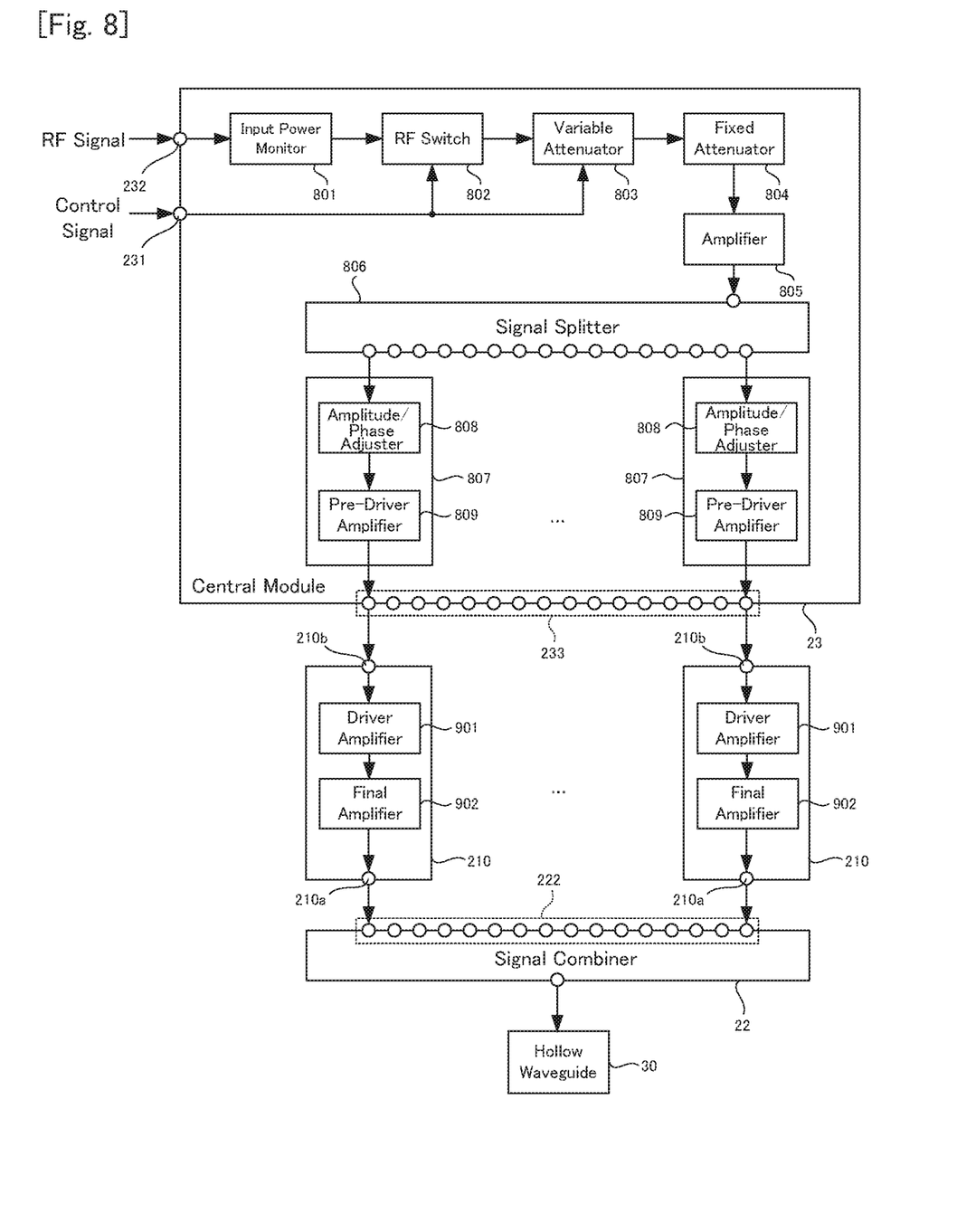
FIG. 8 is a block diagram of a hardware structure of the amplification apparatus.

Next will be described a hardware structure of the amplification apparatus, and more particularly, a hardware structure of the central module and the amplifier unit. FIG. 8 is a block diagram of a hardware structure of the amplification apparatus.

As shown in FIG. 8, the central module 23 includes the control signal input terminal 231, the RF signal input terminal 232, and the sixteen RF signal output terminals 233, all of which are mentioned above. In addition, the central module 23 includes an input power monitor 801, an RF switch 802, a variable attenuator 803, a fixed attenuator 804, an amplifier 805, a signal splitter 806 and sixteen adjustments 807.

The input power monitor 801 determines whether or not the power level of an input RF signal received at the RF signal input terminal 232 is appropriate and, if so, outputs the received RF signal to the RF switch 802. The RF switch 802 may be set either "ON" or "OFF" depending on a control signal received at the control signal input terminal 231. The RF switch 802 then outputs the received RF signal to the variable attenuator 803 only when the RF switch is set "ON". The variable attenuator 803, the attenuation level of which is variable and adjustable, reduces the power level of the received RF signal based on a control signal received at the control signal input terminal 231, and outputs the resulting attenuated RF signal to the fixed attenuator 804. The fixed attenuator 804, the attenuation level of which is fixed, reduces the power level of the received RF signal and outputs the resulting attenuated RF signal to the amplifier 805. The amplifier 805 amplifies the received RF signal and outputs the resulting amplified RF signal to the signal splitter 806. The signal splitter 806 splits the received FR signal into sixteen RF signals and outputs them to the sixteen adjustments 807, respectively.

Each adjustment 807 includes an amplitude/phase adjuster 808 and a pre-driver amplifier 809. Each adjustment 807 serves to adjust the amplitude and the phase of the received RF signal, which is outputted from the signal splitter 806, and further serves to output the resulting adjusted RF signal through the RF signal output terminal 233 to the associated one of the amplifier units 210. The amplitude/phase adjuster 808, which may include, for example, a variable attenuator and a phase shifter, adjusts the amplitude and the phase of the received RF signal and outputs the resulting adjusted RF signal to the pre-driver amplifier 809. The pre-driver amplifier 809 amplifies the received RF signal and outputs the resulting amplified RF signal to the associated one of the amplifier units 210. The adjustment levels of the amplitude adjustment and the phase adjustment are settable for each adjustment 807 independently from other adjustments 807, and the setting of the adjustment levels for all the adjustments 807 is achieved, for example, before shipment of the amplification apparatus 1, such that all the RF signals to be outputted from the respective adjustments 807 may have a substantially equal amplitude and may be substantially in phase with one another.

Each amplifier unit 210 includes, in addition to the RF signal output terminal 210a and the RF signal input terminal 210b, a driver amplifier 901 and a final amplifier 902, each formed as a semiconductor amplifier device. The driver amplifier 901 serves to amplify the RF signal, which is inputted to the amplifier unit 210 through the RF signal input terminal 210b, and to output the resulting amplified RF signal to the final amplifier 902. The final amplifier 902 serves to amplify the received RF signal, which is outputted from the driver amplifier 901, and to output the resulting amplified RF signal through the RF signal output terminal 210a to the signal combiner 22.

The respective RF signal output terminals 210a of the sixteen amplifier units 210 are in connection with the sixteen RF signal input terminals 222 of the signal combiner 22, respectively, and the RF signals outputted from the amplifier units 210 are inputted to the signal combiner 22. The inputted RF signals are combined together by the signal combiner 22, and the resulting combined RF signal is outputted to the hollow waveguide 30.

As mentioned above, the plurality of amplifier units 210 are circularly disposed to form a generally cylindrical shape, and the amplifier units 210 are provided with the respective water cooling heat sinks 211, into which cooling water flows equally with one another, so that the plurality of amplifier units 210 may be cooled equally with one another. Further, with this structure, another structure participating in the amplification of RF signals may be disposed within the cylindrical hollow space defined by the plurality of amplification units 210 and the plurality of water cooling heat sinks 211, so that the amplification apparatus 1 may be made more compact while reliability of the equal cooling of the amplifier units is ensured.

The above described embodiment of the present invention is for illustrative purpose only and is not intended to limit the scope of the invention. The novel embodiment may be embodied in various other forms, and may be subject to various abbreviations, substitutions and alterations without departing from the spirit of the invention. The above described embodiment and any possible modifications thereof are encompassed within the scope and spirit of the invention, as well as within the scope of the claimed invention and of any equivalents thereof.

LIST OF REFERENCE NUMERALS

1 Amplification apparatus
22 Signal combiner
210 Amplifier unit
211 Water cooling heat sink
806 Signal splitter

What is claimed is:
1. An amplification apparatus, comprising:
a signal splitter for splitting an input radio frequency signal and outputting the resulting split radio frequency signals;
a plurality of amplifier units for amplifying the radio frequency signals outputted from the signal splitter, the amplifier units being disposed circularly to form a generally cylindrical shape;
a plurality of water cooling heat sinks disposed circularly at positions corresponding to positions of the plurality of amplifier units so as to cool the plurality of amplifier units by cooling water;
a signal combiner for combining the radio frequency signals outputted from the plurality of amplifier units, respectively, and outputting the resulting combined radio frequency signal,
an input power monitor for determining whether or not a power level of an input radio frequency signal received by the signal splitter is appropriate; and
an amplitude/phase adjuster for adjusting an amplitude and a phase of a radio frequency signal outputted from the signal splitter, wherein the input power monitor and the amplitude/phase adjuster are disposed within a hollow space of the generally cylindrical shape.

2. The amplification apparatus according to claim 1, further comprising:
   a water supply rim pipe having a circular ring shape, into which cooling water to be supplied to the plurality of water cooling heat sinks flows.

3. The amplification apparatus according to claim 1, further comprising:
   a water drainage rim pipe having a circular ring shape, into which cooling water flowing out of the plurality of water cooling heat sinks flows.

4. The amplification apparatus according to claim 1, wherein:
   the signal combiner is disposed within a hollow space of the generally cylindrical shape.

5. The amplification apparatus according to claim 1, wherein:
   the plurality of amplifier units each has a plurality of semiconductor amplifier devices.

\* \* \* \* \*